US005763016A

United States Patent [19]
Levenson et al.

[11] Patent Number: 5,763,016
[45] Date of Patent: Jun. 9, 1998

[54] METHOD OF FORMING PATTERNS IN ORGANIC COATINGS FILMS AND LAYERS

[75] Inventors: Eric O. Levenson, Los Altos; Ahmad Waleh, Palo Alto, both of Calif.

[73] Assignee: Anon, Incorporated, San Jose, Calif.

[21] Appl. No.: 771,392

[22] Filed: Dec. 19, 1996

[51] Int. Cl.$^6$ .................................................. C08J 7/04
[52] U.S. Cl. ....................... 427/510; 427/259; 427/261; 427/269; 427/270; 427/272; 427/273; 427/282; 427/287; 427/322; 427/327; 427/335; 427/407.1; 427/409; 427/412.1; 427/555; 427/556; 427/557; 427/560
[58] Field of Search ........................ 427/555, 556, 427/557, 558, 560, 259, 261, 269, 270, 272, 273, 282, 287, 335, 407.1, 409, 412.1, 322, 327, 510

[56] References Cited

U.S. PATENT DOCUMENTS

| | | | |
|---|---|---|---|
| 4,179,071 | 12/1979 | Kozacka | 239/397.5 |
| 4,669,544 | 6/1987 | Nimerick | 166/300 |
| 4,778,536 | 10/1988 | Grebinski | 134/36 |
| 4,915,912 | 4/1990 | Walles et al. | 422/160 |
| 5,030,399 | 7/1991 | Walles et al. | 264/83 |
| 5,037,506 | 8/1991 | Gupta et al. | 156/646 |
| 5,158,100 | 10/1992 | Tanaka et al. | 134/105 |

OTHER PUBLICATIONS

Stanley Wolf and Richard N. Tauber, "Silicon Processing For The VLSI Era", *Process Technology*, vol. 1 (1986), pp. 564–564; (no month avail.).

"Choose the Right Process to Strip Your Photoresist", *Semiconductor International*, Feb. 1990, pp. 83–87.

"New Concerns in Dry Oxygen Ashing", *Semiconductor International*, Mar. 1996, p. 44.

"What's Driving Resist Dry Stripping?", *Semiconductor International*, Nov. 1994, pp. 61–64.

*Primary Examiner*—Bernard Pianalto
*Attorney, Agent, or Firm*—Benman & Collins

[57] ABSTRACT

Water-free, gaseous sulfur trioxide is used as an agent to form patterns in organic coatings, films, and layers, including photoresists, by etching areas exposed to the agent through an overlying mask or by developing a latent image of the desired pattern using the agent as a dry-developer.

31 Claims, No Drawings

METHOD OF FORMING PATTERNS IN ORGANIC COATINGS FILMS AND LAYERS

BACKGROUND OF THE INVENTION

1. Field of the Invention

The present invention is related to the preparation and development of latent images and patterns contained in or on organic coatings, films, and layers, including photosensitive and non-photosensitive organic materials, polymerized photoresists, paints, resins, multilayer organic polymers, certain organo-metallic complexes, positive optical photoresist, negative optical photoresist, electron-beam photoresists, X-ray photoresists, and ion-beam photoresists which are commonly required in the manufacture of semiconductor devices and wafers, ceramic devices, photomasks, liquid crystal display devices, flat-panel displays, printed circuit boards, magnetic read/write heads, thin-film read/write heads, as well as other substrates upon which organic films may have been deposited. As used herein, a latent image is an undeveloped pattern created in a material by modifying the physical or chemical characteristics of the material in desired locations as an analog of the desired real image. Subsequent development of the latent image is usually required to convert the latent image into a real image.

2. Description of the Related Art

Preparing a pattern in organic coatings, films, and layers, including photosensitive and non-photosensitive organic materials, is one of the necessary steps in the manufacture of semiconductor devices and wafers, ceramic devices, photomasks, liquid crystal display devices, flat-panel displays, printed circuit boards, magnetic read/write heads, thin-film read/write heads, as well as other substrates upon which organic films may have been deposited. Preparation of such patterns using prior art requires creating and developing a latent image of the pattern in the organic coating by (1) uniformly applying a photosensitive organic coating to a substrate, then (2) treating the coating to promote good image-formation during subsequent processing, then (3) exposing the coating to additional treatment so as to create a latent image of the desired pattern in the coating, then (4) further treating the coating to promote proper development of the latent image into a real pattern during subsequent processing, then (5) developing the latent image into a real pattern using various liquid developers or plasma etching so as to remove the areas of unwanted coating, and then (6) treating the developed coating to promote future adhesion and etch resistance while in use.

Various organic compounds are usually employed as coating materials because their physical properties can be modified by exposure to certain treatments so as to make removal of exposed material either easier or more difficult than removal of unexposed material. Although many proprietary formulations may be used, these organic compounds generally include (1) negative optical photoresists where exposure to high-energy electromagnetic radiation, such as ultra-violet light (UV) radiation, generates cross-linked molecules in the exposed region thus reducing solubility of the photoresist in exposed areas; (2) positive optical photoresists where exposure to high-energy electromagnetic radiation, such as UV radiation, results in photo-chemical decomposition of the exposed region thus increasing solubility of the photoresist in exposed areas; (3) electron beam (E-beam) resists, and X-ray resists where exposure to high-energy radiation degrades the resist properties thus changing the solubility of the resist in exposed areas, and (4) ion-beam resists where exposure to an ion-beam changes the properties of the resist in the exposed areas. Exposure of the sensitive coating material, or resist, is usually carried out by either (1) projecting an image of the desired pattern on to the sensitive coating material through a mask, by (2) controlling a moving beam of electromagnetic radiation, including electron-beams and ion beams, so as to trace out the desired pattern of exposure in the coating material, or by (3) preparing a copy of the desired pattern in a conformal, overlying organic or inorganic film which masks those areas of the coating to be protected from exposure.

Inorganic photoresists have been examined for use as masking materials, but have had only limited success in meeting processing requirements, and are thus not widely used. Some of the difficulties of this prior art include (1) complexity of the methods required by inorganic resists and (2) the unavailability of suitable processing equipment.

After creating the latent image of the desired pattern in the coating, the latent image is normally developed into a real pattern by removing those areas of unwanted coating. Once a developed pattern has been prepared in the coating, it can be used to mask selected areas of the substrate upon which it lies from subsequent processing operations.

Two general techniques have been investigated in the prior art for developing a desired pattern in an organic coating. These include (1) wet-development techniques, which usually involve creating a latent image of areas with different solubility, and then washing away the undesired resist with a wet developer liquid; and (2) dry-development techniques, which involve the use of either (a) resists which are subject to self-dissolution under the right conditions, or (b) resists which exhibit differential sensitivity to plasma etching after appropriate treatment.

Wet developers take advantage of a differential solubility between the exposed and unexposed areas in the photoresist to wash away undesired resist. To effect the washing away of undesired photoresist, development is carried out by (1) immersing the coated substrate in the developer liquid, or by (2) spraying liquid developer on the surface of the coated substrate. In both methods, substrates may be processed individually, or in batches of several substrates at a time. In all wet development methods, it is important that the entire coating on the substrate receive uniform exposure to developer and that the developer retain a uniform concentration during the development process to minimize the effects of chemical depletion. When sufficient development, or resist removal, has occurred, it is necessary to stop the development process by removing the liquid developer. This is done by rinsing and drying the substrate at the correct time in the development process. In order to provide for uniformity of the development process, both within the same substrate as well as between different substrates, it is important to have a development process with a wide processing latitude which is relatively insensitive to minor variations in processing parameters such as the time of development, developer concentration, and developer temperature. It is thus important to have tight control over these wet development processing variables in order to provide for uniform development of features such as line-widths and critical dimensions within the resist coating.

Wet developers for positive optical photoresists are normally diluted alkaline solutions which are rinseable in water, while negative optical photoresists require organic solvents of various kinds for both development and rinsing (e.g., n-butyl acetate). Because of the difficulties of working with solvents which are often toxic or hazardous liquids, and because negative optical photoresists often swell during development thus making precise replication of features difficult, positive optical photoresists are often preferred in practice, particularly for devices with submicrometer features, where photoresist-swelling makes negative resists unsuitable for use. Resist-swelling in wet developers and the requirement for using difficult organic solvents thus make negative resists unsuitable for use despite certain favorable characteristics of negative resists such as (1) better adhesion to certain substrates, (2) lower material costs, (3) faster development speed, and (4) wider process latitude in many cases.

A wide variety of organic polymer photoresist coating formulations, often with complex chemical composition, is required to optimize the development of the latent image for a given set of manufacturing requirements. Considerations of importance in the photoresist formulation include (1) sensitivity of the resist to the energy of the exposure wavelength, (2) spectral response, or the sensitivity of the photoresist to different wavelengths, (3) contrast capabilities of the photosensitive resist, (4) resolution, or the size of the smallest feature which can be reproduced in the resist, (5) ease of application, development and removal, including the process latitude, or sensitivity to minor processing variations, (6) etch resistance to further processing of the resist-covered substrate, and (7) toxicity of the various solvents and chemicals required. Photoresist formulation often requires tradeoffs between these many considerations, resulting in (1) the use, in practice, of formulations with less than optimum performance characteristics; (2) the use of a wide-variety of different photoresists and developers for different purposes; (3) the requirement for a variety of different photoresist application and development processes by manufacturers; and (4) the use of large volumes of sometimes hazardous and toxic liquid reagents as developers and rinsers.

Because of these difficulties, and others, prior art has explored the use of dry-developable resists. A practical, dry-developable resist would (1) reduce or eliminate the resist swelling problems characteristic of wet-developable negative photoresists; (2) reduce or eliminate the contamination and defect problems characteristic of wet-processing in liquids; (3) reduce or eliminate the difficulty of using large volumes of hazardous or toxic liquids; (4) facilitate the preparation of patterns with improved geometrical features; and (5) facilitate the preparation of patterns with improved resolution.

Dry-developable photoresists have been investigated which make use of either the self-dissolution properties of certain resists after exposure to radiation and vacuum heating (such as some poly(olefin sulfones) and plasma-deposited methylmethacrylate and tetramethylin), or the increased resistance to plasma etching shown by certain resists after exposure to radiation.

Dry-developable photoresists have had only limited success in meeting the processing requirements of manufacturers and are not used widely in practice. Some of the difficulties of this prior art include (1) difficulty in is achieving sufficient differential resistance to plasma-etch resistance between exposed and unexposed areas in the resist coating and (2) the unavailability of production-worthy, plasma-developable resists.

U.S. Pat. No. 5,037,506, issued Aug. 6, 1991, to S. Gupta et al and entitled "Method of Stripping Layers of Organic Materials", discloses and claims the use of gaseous sulfur trioxide to remove various organic coatings, polymerized photoresist, and especially implant and deep-UV hardened resist layers, during the manufacture of semiconductor or ceramic devices. While the method disclosed or claimed in this patent is useful, there are further needs for selectively removing parts of such coatings, so as to create a predetermined pattern in the remaining organic coating.

Specifically, there remains a need for a suitable dry-method to pattern organic coatings, films, and layers, including photosensitive arid nonphotosensitive organic materials, polymerized photoresists, paints, resins, multilayer organic polymers, certain organo-metallic complexes, positive optical photoresist, negative optical photoresist, electron-beam photoresists, X-ray photoresists, and ion-beam photoresists, in both horizontal and vertical planes, as part of the manufacturing process for a broad range of substrates including semiconductor devices and wafers, ceramic devices, pholtomasks, liquid crystal display devices, flat-panel displays, printed circuit boards, magnetic read/write heads, thin-film read/write heads, as well as other substrates upon which organic films may have been deposited. This need is especially notable where those substrates contain very small features of less than about 5 micrometers, or where they contain features with very high aspect-ratios (depth:width ratio), and where: (1) liquid developers have difficulty penetrating those features due to surface tension and capillary effects; (2) liquid developers are undesirable due to the contamination introduced and spread by liquids; (3) liquid developers are undesirable due to the difficulty of handling and disposing of hazardous or toxic developer and rinsing reagents; (4) liquid developers are undesirable due to difficulty of handling and disposing of large volumes of developer reagents; (5) there is a requirement for improved control over the development process through the use of gas-phase, rather than liquid-phase, processes; (6) patterns with improved uniformity in line widths and critical dimensions within the same substrate as well as between different substrates are desired (e.g., by providing improved control over developer concentration, development exposure time and development temperatures); (7) patterns with improved resolution and geometrical features are desired (e.g., by making possible a more practical, or more effective, multilayer resist process or by enabling the development of small features now limited by the ability of liquid developers to overcome capillary action and surface tension or by providing better control over the development process variables than is possible with wet development processes); (8) a method for developing latent images in negative optical photoresist without causing resist-swelling is desired because of the favorable characteristics of negative optical photoresist; (9) plasma etching techniques are inadequate due to the damage they may cause to underlying layers or substrates; (10) plasma etching techniques are inadequate due to poor differential plasma resistance between the latent image and the surrounding material; (11) there is a requirement for faster development throughput times which may be provided by a dry, batch development capability; and (12) there is a requirement to create a pattern in a non-photosensitive organic coating material, such as in a non-photosensitive, organic interlayer, dielectric films.

SUMMARY OF THE INVENTION

Accordingly, it is an object of this invention to provide a method for preparing patterns in organic coatings, films, and layers, including photosensitive and non-photosensitive organic materials, polymerized photoresists, paints, resins, multilayer organic polymers, certain organo-metallic complexes, positive optical photoresist, negative optical photoresist, electron-beam photoresists, X-ray photoresists, and ion-beam photoresists used in the manufacture of semiconductor devices and wafers, ceramic devices, photomasks, liquid crystal display devices, flat-panel displays, printed circuit boards, magnetic read/write heads, thin-film read/write heads, as well as other substrates upon which organic films may have been deposited, which does not make use of liquid photoresist developers, liquid etchants, or plasma processes. By preparing "patterns" is meant the preparation of desired patterns, such as may be required (1) as a mask in multilevel resist processes, or (2) in an interlayer dielectric film, or (3) in a damascene process for preparing interconnects in an interlayer dielectric.

It is a further object of this invention to provide a method for preparing patterns in organic coatings, films, and layers, including photosensitive and non-photosensitive organic materials, polymerized photoresists, paints, resins, multilayer organic polymers, certain organo-metallic complexes, positive optical photoresist, negative optical photoresist, electron-beam photoresists, X-ray photoresists, and ion-beam photoresists which provides for better control over linewidth dimensions and reduced variations in dimensions in the developed organic coating by using a gas-phase process rather than a liquid-phase process. This is accomplished by being able to stop the development process more quickly than is possible with wet development methods and by providing a more uniform chemical process which is less subject to depletion.

It is yet another object of this invention to provide a method for preparing patterns in organic coatings, films, and layers, including photosensitive and non-photosensitive organic materials, polymerized photoresists, paints, resins, multilayer organic polymers, certain organo-metallic complexes, positive optical photoresist, negative optical photoresist, electron-beam photoresists, X-ray photoresists, and ion-beam photoresists which provides for more uniform development of features in the coating, both across the same substrate and the between different substrates of the same batch, by using a gas-phase process rather than a liquid-phase process. Again, this is accomplished by being able to stop the development process more quickly than is possible with wet development methods and by providing a more uniform chemical process which is less subject to depletion.

It is a still further object of this invention to provide a method for preparing patterns in organic coatings, films, and layers, including photosensitive and non-photosensitive organic materials, polymerized photoresists, paints, resins, multilayer organic polymers, certain organo-metallic complexes, positive optical photoresist, negative optical photoresist, electron-beam photoresists, X-ray photoresists, and ion-beam photoresists which provides a capability for creating and developing smaller geometries, and features with greater aspect-ratios, than is now practically possible under the prior art, by using a gas-phase process rather than a liquid-phase process.

It is another object of this invention to provide a method for preparing patterns in negative optical photoresists which reduces or eliminates the requirement for using organic solvents or developers, thus reducing or eliminating resist swelling and providing for a broader range of application for negative optical resists used in the manufacture of semiconductor devices and wafers, ceramic devices, photomasks, liquid crystal display devices, flat-panel displays, printed circuit boards, magnetic read/write heads, thin-film read/write heads, as well as other substrates upon which organic films may have been deposited.

It is a further object of this invention to provide a method for preparing patterns in organic coatings, films, and layers, including photosensitive and non-photosensitive organic materials, polymerized photoresists, paints, resins, multilayer organic polymers, certain organo-metallic complexes, positive optical photoresist, negative optical photoresist, electron-beam photoresists, X-ray photoresists, and ion-beam photoresists which does not require the use of photosensitive organic photoresists.

It is yet another object of this invention to provide a method for preparing patterns in organic coatings, films, and layers, including photosensitive and non-photosensitive organic materials, polymerized photoresists, paints, resins, multilayer organic polymers, certain organo-metallic complexes, positive optical photoresist, negative optical photoresist, electron-beam photoresists, X-ray photoresists, and ion-beam photoresists which allows the use of pattern materials with better resistance to the subsequent plasma etching commonly required in the manufacture of semiconductor devices and wafers, ceramic devices, photomasks, liquid crystal display devices, flat-panel displays, printed circuit boards, magnetic read/write heads, thin-film read/write heads, as well as other substrates upon which organic films may have been deposited.

In accordance with the invention, a reactive agent comprising sulfur trioxide and, optionally, other process gases is used to differentially oxidize, sulfonate, or otherwise react to cause selected parts of a masked image of a pattern, or a latent image of a pattern, contained in all types of organic coatings, films, and layers, including photosensitive and non-photosensitive organic materials, polymerized photoresists, paints, resins, multilayer organic polymers, certain organo-metallic complexes, positive optical photoresist, negative optical photoresist, electron-beam photoresists, X-ray photoresists, and ion-beam photoresists to be substantially completely removable by subsequent chemical or physical treatment.

As used herein, the term "coating" is meant any covering on a substrate, including, but not limited to, a coating, a film, or a layer.

After first coating the surface of a substrate with an appropriate organic material, and depending upon the nature of the organic material, a latent image of the desired pattern is then reproduced in the coating, or a conformal organic or inorganic mask of the desired pattern is then reproduced on the surface of the coating.

In the case that a latent image of the desired pattern is reproduced in the coating, it is reproduced by projecting an image of the pattern on the coating with either (1) property-modifying, electromagnetic radiation including infrared, ultraviolet, and/or high-energy wavelengths as provided by E-beam or X-ray exposure, or (2) a property-modifying ion-beam. Alternatively, the latent image of the desired pattern may be reproduced in the coating through a conformal organic or inorganic mask of the desired pattern which is first reproduced on the surface of the coating by means of evaporation, sputtering, use of a multi-level resist process, plasma etching, or other masking method. The latent image of the desired pattern is then prepared in the coating by exposing the coating to a property-modifying precursor treatment, such as exposure to a gas such as water vapor, thus allowing water to be absorbed into the exposed region of the organic film, thereby increasing the water content of that region of the organic film and changing its reaction rate characteristics with sulfur trioxide gas.

In the case that a conformal organic or inorganic mask of the desired pattern is first reproduced on the surface of the coating in order to prepare patterns in the coating without using a latent image, the mask is reproduced on the coating by means of evaporation, sputtering, use of a multi-level resist process, plasma etching, or other masking method.

The coated substrate, containing either the latent image of a desired pattern in the coating, or a conformal masking pattern on the surface of the coating, is exposed to the sulfur trioxide and other process gases which differentially react with the exposed organic coating, thus causing the desired portion of the organic coating to be substantially removable by subsequent chemical or physical treatment. The reactive power of the process gases may be usefully modified (1) by reducing the concentration of the appropriate agent at an appropriate time in the process, (2) through the addition of various gases at an appropriate time in the process, (3) through the addition of heat to the process at an appropriate time in the process, or (4) through the use of an end-point detector to selectively stop the reaction as required.

Differential reaction of the organic coating with the process gases may thus be controlled by (1) changing the reaction rate properties of the different parts of the latent image in the coating, film or layer; (2) protecting selected parts of the coating from development by means of a conformal mask on the surface of the coating; and by (3) changing the reactive power of the process gases which may include sulfur trioxide gas.

After initial flushing with inert gases, substrates containing either latent images in the coating, or masked patterns on the surface of the coating, are exposed to regulated quantities of gaseous sulfur trioxide and other process gases. These gases are dispensed into chambers, or a series of closed chambers with good vacuum integrity, which contain the substrates. Additional chemical and physical treatment may be required prior to, during, and/or subsequent to exposure to these process gases for the purpose of improving the effectiveness of the method. Liquid or solid sulfur trioxide, whether in alpha, beta, or gamma form, or a mixture thereof, may be stored and used as the source of vapor. Sulfur trioxide is an extremely strong oxidizing and sulfonating chemical, and is very effective as an agent in removing a variety of organic materials. Being in a gas phase, it achieves a more thorough contact with the surfaces of submicrometer grooves and crevices than is possible by liquid development solutions. Being in a gas phase, it is also more quickly introduced and removed from the reaction interface when desired; under the correct conditions of this invention, it is less subject to depletion at the reaction interface; it is less likely to introduce contaminants than liquid phase developers; and it is more easily maintained in a homogeneous state during the development process.

The method for developing latent images in organic coatings may be carried out over a temperature range which is unlimited with regard to the effectiveness of the method. However, some embodiments of this invention require a temperature range between room temperature and 400° C. for optimum effectiveness for specific materials and substrates.

The use of a dry method for developing latent images in organic materials as described in this invention provides for more efficient, more effective, and more environmentally benign processing of semiconductor devices and wafers, ceramic devices, photomasks, liquid crystal display devices, flat-panel displays, printed circuit boards, magnetic read/ write heads, thin-film read/write heads, as well as other substrates upon which organic films may have been deposited, than is available under the prior art.

DETAILED DESCRIPTION OF THE INVENTION

Details of a specific embodiment of the present invention is described to illustrate the best mode presently contemplated by the inventors for practicing the invention. Alternative embodiments are also briefly described as applicable.

A method is set forth to create and develop latent images contained in organic coatings, films, and layers, including photosensitive and non-photosensitive organic materials, polymerized photoresists, paints, resins, multilayer organic polymers, certain organo-metallic complexes, positive optical photoresist, negative optical photoresist, electron-beam photoresists, X-ray photoresists, and ion-beam photoresists that may be used in the manufacture of semiconductor devices and wafers, ceramic devices, photomasks, liquid crystal display devices, flat-panel displays, printed circuit boards, magnetic read/write heads, thin-film read/write heads, as well as other substrates upon which organic films may have been deposited.

As indicated above, "coating" includes, without limitation, any covering on a substrate, such as coating, film, and layer.

Examples of some surfaces which ma y be beneficially treated in accordance with the present invention include materials used in the manufacture of semiconductor wafers, and devices comprised of materials such as Group IV elements (e.g., silicon, polysilicon, and germanium), III–V compound semiconductors (e.g., gallium arsenide), oxides (both crystalline and glassy), nitrides, oxynitrides, organic films, photoresist layers, organic dielectrics (e.g. organic polymers), organo-metallic complexes and polymers, metals and metal alloys.

Examples of organic dielectric materials suitably employed in the practice of the invention include polyimides, copolyimides, polyamides, polyamide-imides, fluorinated polyimides, fluorinated poly(arynenethers), perfluorinated alkylene oxides, parylene (N, C, D, or F type), poly(phenylquinoxalines), poly-naphthalene, polyfluorinated naphthalene, benzocyclobutene (BCB), amorphous fluoropolymers, such as polytetrafluoroethylene, perfluorocyclobutane aromatic ether (PFCB), polynorbornene, and fluorinated carbon.

A particularly important feature of this invention is that the method can develop a latent image of a desired pattern without the use of liquid photoresist developers or plasma processes.

Another important feature of this invention is that the method can etch a pattern in an organic coating which has been masked by a conformal, etch-resistant masking pattern without resorting to the use of plasmas or liquid etchants.

Yet another important feature of this invention is that the method can prepare a pattern in an organic coating without the need for photosensitive organic materials.

The basic concept behind this invention is that a novel chemical agent, under the correct processing conditions and comprising essentially of sulfur trioxide, is used in gaseous form to dry-etch a masked pattern, or to dry-develop a latent image, that may be contained in all types of organic coatings, films, and layers, including photosensitive and non-photosensitive organic materials, polymerized photoresists, paints, resins, multilayer organic polymers, certain organo-metallic complexes, positive optical photoresist, negative optical photoresist, electron-beam photoresists, X-ray photoresists, and ion-beam photoresists. An example of such a latent image in a non-photosensitive coating, film or layer would include material where a latent image is defined by its chemical composition or water content, possibly created by exposure to reactive gases or water vapor through a conformal mask or multi-level resist process, thus modifying the physical properties of the film, and its differential sensitivity to reaction with the process gases, in the exposed areas. A conventional method, included here as an example, for creating such a latent image in a photosensitive coating, film or layer would include a coating where the latent image is defined by its molecular weight and thus by its physical properties, including its reaction characteristics with the process gases, in the exposed areas. The method is thus controlled by changing the reaction characteristics of different areas of the pattern or latent image when exposed to the sulfur trioxide process gases, and/or by changing the reactive power of the process gases, including sulfur trioxide, during the development reaction.

The gaseous form of sulfur trioxide, coupled with its reactive power under certain conditions, is an agent which provides for differential reaction with, and removal of, a variety of properly treated organic coatings, films and layers from submicrometer grooves and crevices which may be inaccessible to liquids. Being in the gaseous phase, it does not suffer from surface tension and capillary-action problems which limit the action of liquid developers by preventing contact with the walls of submicrometer grooves and crevices. Also being in the gaseous phase, it suffers less from depletion and reaction-product build-up problems at the chemical interface which may limit the action of liquid developers. For these reasons, such a method may make possible the development of features in the organic coating, film or layer with (1) smaller dimensions, such as size and aspect-ratio; (2) improved feature uniformity; and (3) fewer areas of undeveloped residues.

In the method of the invention, sulfur trioxide, which may be in alpha form, beta form, gamma form or a mixture thereof, is stored and used as the primary oxidizing, sulfonating, and otherwise reactive agent. Gamma-sulfur trioxide, with a melting point of 16.80° C., is the preferred form for sulfur trioxide to be used in the invention, and is the form in which $SO_3$ exists when it is maintained in absolutely pure and anhydrous condition. In general, stabilized gamma-sulfur trioxide is used, where addition of a small quantity of inhibitor (stabilizer) prevents formation of the high melting-point beta (32.5° C.) and alpha (62.3° C.) forms. Gamma-sulfur trioxide is commercially available with such inhibitors. The stabilized sulfur trioxide can readily be remelted, if it is allowed to solidify. Both stabilized and unstabilized sulfur trioxide may be used in the method of this invention. Water-free, gaseous sulfur trioxide is employed in the selective removal of the organic films, coatings and layers. It is an important requirement of this method to minimize the water content of the sulfur trioxide gas at the correct time in the method and to control the water content during the practice of the method.

The dry-etch and dry-develop method of the invention is advantageously employed in both batch (multiple substrates) and single-substrate operation modes. In either case, regulated quantities of gaseous sulfur trioxide are dispensed, continuously, or at appropriate intervals, into closed, vacuum-sealed chamber(s), which are required primarily to minimize and control the moisture level. Moisture level may also be minimized and controlled by maintaining the walls of the chamber(s) at elevated temperatures. The flow rate and pressure of the sulfur trioxide gas and other process gases, and the time of exposure needed for the method will depend on the size of the chamber and the number of substrates, and their sizes, to be subjected to the method at one time. In some cases, it may be necessary to stop the development or etching reaction before the reactants are exhausted. In such cases, an end-point detector may be employed to determine when to stop the reaction. In the method of this invention, the reaction rate may be decreased or halted at the desired moment by, for example, (1) introducing additional, non-reactive gases to the chamber, such as nitrogen or argon, thus diluting the sulfur trioxide so as to decrease the reactive power of the gases in the chamber; or (2) reducing the temperature of the reaction interface by reducing the temperature of the substrate; or (3) by removing the substrate from the processing chamber; or (4) by removing the reactive process gases from the process chamber. The reaction rate may be increased at the desired moment by, for example, (1) introducing additional process gases to the chamber, such as anhydrous sulfur trioxide, so as to increase the reactive power of the gases in the chamber; or (2) increasing the temperature of the reaction interface by heating the substrate.

After introduction of the substrate containing the masked pattern or the latent image into the process chamber, the chamber is purged, one or several times, with dry, inert gas, such as nitrogen or one of the commonly used inert gases. The chamber is then evacuated to a suitable vacuum, such as on the order of about $10^{-3}$ Torr. Water-free, gaseous sulfur trioxide is then introduced into the chamber as a reactive agent for differentially oxidizing, sulfonating or otherwise reacting with the different areas on the organic coating, film or layer as defined by the masked pattern or the latent image. The directional flow of the process gases through the processing mechanism is controlled by means of the physical design of the process chamber in order to improve the effectiveness of the method. Depending on the specific nature of the coating, other chemically reactive process gases may be dispensed in a similar fashion, either prior to the introduction of the sulfur trioxide gas, simultaneously with the sulfur trioxide gas, or subsequent to the introduction of the sulfur trioxide gas, for the purpose of improving the effectiveness of the method. The substrates introduced to the process chamber require specific physical treatment (for example, dry heating, exposure to high-energy electromagnetic radiation, rinsing in de-ionized water) either before, during or after exposure to the process gases for the purpose of improving the effectiveness of the method.

While the total time of exposure of the coated substrate to the gaseous sulfur trioxide and other process gases varies depending on several factors, the typical time of exposure is less than five minutes. These factors include (1) the reaction rate properties of the different areas in the masked pattern or in the latent image, (2) the thickness of the organic coating, film or layer, (3) the number of substrates in the process chamber, (4) the size of each substrate, (5) the reaction power of the process gases including sulfur trioxide (which is controllable over time), as well as (6) other processing conditions.

However, the determination of the time for a particular organic material, substrate, and set of processing conditions is easily done, and constitutes no undue experimentation.

The substrate may be maintained at room temperature during exposure to the gaseous sulfur trioxide process gases or heated to an elevated temperature. If heated, the temperature is not a limitation of the method. Temperature of the substrate and the processing environment is controlled, and may be limited, in order to improve the effectiveness of the method. Typically, the temperature range is between room temperature and 400° C.

Following differential reaction of the masked pattern on or the latent image contained in the organic coating, film or layer by exposure to the process gases, which may include gaseous sulfur trioxide, the substrate may be further treated with chemical and physical processes to remove any development reaction products. For example, the substrate may be rinsed in deionized water, treated with a high-frequency sound, both ultrasonic and megasonic, cleaning processes, sprayed with solvents such as the lower alkanols (1 to 5 carbon atoms), dipping in isopropyl alcohol, acetone, and mixtures thereof.

The method of the invention has no deleterious effect on the surface of the inorganic substrate or on any inorganic coatings thereon. For example, surface oxides, such as silicon oxide and oxide glasses, nitrides, oxynitrides, metals, suicides, silicon, polysilicon, and the like are unaffected by the process.

Without subscribing to a particular theory and independent of the details of the sulfur trioxide reactions, the underlying principle of operation of the invention is the differential sensitivity of all organic coatings, films and layers to this reaction, or reactions, at different rates based upon different physical properties between different areas in the masked pattern or in the latent image, and upon controllable changes to the reactive power of the sulfur trioxide process gases over time. The method of the invention can be carried out whether sulfur trioxide is used in the form of pure or stabilized gas, or vaporized from a pure or stabilized liquid sulfur trioxide. The method of the invention equally applies when the reactivity of the sulfur trioxide vapor is obtained from a mixture of chemical substances, in gaseous, liquid, or solid form, with the net effect of producing sulfur trioxide vapor, in pure form or otherwise, at the rate and quantity needed to carry out specific development reactions.

The method of the invention remains equally effective when submicrometer structural features are added to the substrate. The method of deposition of the organic coating on the substrate is not critical to the method of this invention. The organic coatings, films, and layers, including photosensitive and non-photosensitive organic materials may include, for example, organic materials deposited by any organic coating method, including roller application, dipping, brushing, spraying, the use of sheets of dry resist, spinon, electrophoresis, plasma deposition, chemical vapor deposition and other common techniques for applying organic coatings, films and layers.

What is claimed is:

1. A method for preparing desired patterns in organic coatings, films, and layers, including photosensitive and non-photosensitive organic materials on a surface of a substrate by selectively removing areas of unwanted coating, said method comprising:
   (1) exposing said organic coatings, films, and layers, including photosensitive and non-photosensitive organic materials to a precursor chemical or physical treatment to create either a masking pattern on the surface of said coating or a latent image in said coating, thereby creating areas of wanted coating and said areas of unwanted coating, followed by
   (2) exposing said organic coating to a vapor consisting essentially of water-free gaseous sulfur trioxide for a determinate period of time, said substrate being maintained at a temperature in the range from about room temperature to 400° C., and followed by
   (3) exposing said organic coatings to a subsequent chemical or physical treatment to dislodge and remove said areas of unwanted coating of said organic coatings, films, and layers, including photosensitive and non-photosensitive organic materials from said substrate, while leaving said areas of wanted coating on said surface of said substrate.

2. The method of claim 1 wherein said organic coating is selected from the group consisting of photosensitive and non-photosensitive organic materials.

3. The method of claim 1 further including:
   (a) treating said substrate to said precursor chemical or precursor physical treatment;
   (b) placing said substrate in a chamber;
   (c) purging said chamber with a dry gas selected from the group consisting of an inert gas and nitrogen;
   (d) introducing said vapor consisting essentially of water-free gaseous sulfur trioxide into said chamber to react with said coating;
   (e) allowing an appropriate time to pass to permit reaction between said sulfur trioxide and said coating;
   (f) ending said reaction between said sulfur trioxide and said coating by exposing said substrate to an end-point chemical treatment or an end-point physical treatment; and
   (g) treating said substrate to a subsequent chemical or physical treatment.

4. The method of claim 3 wherein said end-point physical treatment includes withdrawal of said sulfur trioxide or withdrawal of said substrate from said chamber.

5. The method of claim 1 wherein said substrate is selected from the group consisting of semiconductor wafers, and devices comprised of materials such as Group IV elements, Group III–V compound semiconductors, oxides, nitrides, oxynitrides, organic films, photoresist layers, organic dielectrics, organo-metallic complexes and polymers, metals and metal alloys.

6. The method of claim 5 wherein said Group IV elements are selected from the group consisting of silicon, polysilicon, and germanium, wherein said III-V compound semiconductors consist essentially of gallium arsenide, wherein said oxides are selected from the group consisting of crystalline and glassy oxides, and wherein said organic dielectrics consist essentially of an organic polymer.

7. The method of claim 6, wherein said organic polymer is selected from the group consisting of polyimides, copolyimides, polyamides, polyamide-imides, fluorinated polyimides, fluorinated poly(arylenethers), perfluorinated alkylene oxides, parylene (N, C, D, or F type), poly (phenylquinoxalines), poly-naphthalene, poly-fluorinated naphthalene, benzocyclobutene (BCB), amorphous fluoropolymers, such as polytetrafluoroethylene, perfluorocyclobutane aromatic ether (PFCB), polynorbornene, and fluorinated carbon.

8. The method of claim 5 wherein said substrate comprises materials employed in semiconductor devices and wafers, ceramic devices, photomasks, liquid crystal display devices, flat-panel displays, printed circuit boards, magnetic read/write heads, thin-film read/write heads, as well as other substrates upon which organic films may have been deposited.

9. The method of claim 1 wherein said precursor chemical or physical treatment includes exposure to chemically active process gases, chemically inert process gases, solvents, heat, electromagnetic radiation of various wavelengths including infrared, deep-UV, and other wavelengths, laser energy, ultrasonic and megasonic sound energy, depending upon said substrate and said organic coating.

10. The method of claim 9 wherein said process gases are selected from the group consisting of oxygen, nitrous oxide, steam, vapor phase hydrogen peroxide, nitrogen, and argon.

11. The method of claim 9 wherein said solvents are selected from the group consisting of water, lower alkanols, acetone, and mixtures thereof.

12. The method of claim 9 wherein said exposure takes place at a temperature between room temperature and 400° C.

13. The method of claim 9 wherein the concentration and temperature of said process gases, the intensity and frequency of said electromagnetic radiation, the intensity and frequency of said sound energy, and the amount of said heat applied during said exposure is varied over the time of said exposure.

14. The method of claim 9 wherein said exposure is performed for a period of time within the range of up to about 5 minutes.

15. The method of claim 1 wherein said subsequent chemical or physical treatment includes further exposure to chemically active process gases, chemically inert process gases, solvents, heat, electromagnetic radiation of various wavelengths including infrared, deep-UV, and other wavelengths, laser energy, ultrasonic and megasonic sound energy, depending upon said substrate and said organic coating.

16. The method of claim 15 wherein said process gases are selected from the group consisting of oxygen, nitrous oxide, steam, vapor phase hydrogen peroxide, nitrogen, and argon.

17. The method of claim 15 wherein said solvents are selected from the group consisting of water, lower alkanols, acetone, and mixtures thereof.

18. The method of claim 15 wherein said exposure takes place at a temperature between room temperature and 400° C.

19. The method of claim 15 wherein the concentration and temperature of said process gases, the intensity and frequency of said electromagnetic radiation, the intensity and frequency of said sound energy, and the amount of said heat applied during said exposure is varied over the time of said exposure.

20. The method of claim 15 wherein said exposure is performed for a period of time within the range of up to about 5 minutes.

21. The method of claim 1 wherein said subsequent chemical or physical treatment is performed after the exposure to said sulfur trioxide, and optionally may include simultaneous exposure to other chemically active process gases, chemically inert process gases, vaporized solvents, heat, electromagnetic radiation of various wavelengths including infrared, deep-UV, and other wavelengths, laser energy, ultrasonic and megasonic sound energy, depending upon said substrate and said organic coating.

22. The method of claim 21 wherein said process gases are selected from the group consisting of oxygen, nitrous oxide, steam, vapor phase hydrogen peroxide, nitrogen, and argon.

23. The method of claim 21 wherein said solvents are selected from the group consisting of water, lower alkanols, acetone, and mixtures thereof.

24. The method of claim 21 wherein said exposure takes place at temperatures between room temperature and 400° C.

25. The method of claim 21 wherein the concentration and temperature of said process gases, the intensity and frequency of said electromagnetic radiation, the intensity and frequency of said sound energy, and the amount of said heat applied during said exposure is varied over the time of said exposure.

26. The method of claim 21 wherein said exposure is performed for a period of time within the range of up to about 5 minutes.

27. The method of claim 1 wherein said coating contains said latent image of said desired patterns surrounded by material of said coating, said latent image defined by a change in the chemical or physical properties in said latent image relative to said surround material in said coating which contains said latent image.

28. The method of claim 1 further including depositing an organic or inorganic mask coating prior to exposure of said organic coating to said vapor.

29. The method of claim 28 wherein said mask coating comprises a material selected from the group consisting of photosensitive and non-photosensitive organic materials, polymerized photoresists, paints, resins, multilayer organic polymers, certain organo-metallic complexes, positive optical photoresist, negative optical photoresist, electron-beam photoresists, X-ray photoresists, and ion-beam photoresists, and inorganic coatings.

30. A method for preparing desired patterns in organic coatings, films, and layers, including photosensitive and non-photosensitive organic materials on a surface of a substrate by selectively removing areas of unwanted coating, said method comprising:

(1) exposing said organic coatings, films, and layers, including photosensitive and non-photosensitive organic materials to a precursor chemical or physical treatment to create either a masking pattern on the surface of said coating or a latent image in said coating, by means of exposure to chemically active process gases, chemically inert process gases, solvents, heat, electromagnetic radiation of various wavelengths including infrared, deep-UV, and other wavelengths, laser energy, ultrasonic and megasonic sound energy, depending upon said substrate and said organic coating, followed by (2) exposing said organic coating to a vapor consisting essentially of water-free gaseous sulfur trioxide for a determinate period of time, said substrate being maintained at a temperature in the range from about room temperature to 400° C., and followed by (3) exposing said organic coatings to a subsequent chemical or physical treatment to dislodge and remove developed portions of said organic coatings, films, and layers, including photosensitive and non-photosensitive organic materials from said substrate by means of further exposure to chemically active process gases, chemically inert process gases, solvents, heat, electromagnetic radiation of various wavelengths including infrared, deep-UV, and other wavelengths, laser energy, ultrasonic and megasonic sound energy, depending upon said substrate and said organic coating.

31. A method for preparing desired patterns in organic coatings, films, and layers, including photosensitive and non-photosensitive organic materials on a surface of a substrate by selectively removing areas of unwanted coating, said method comprising:

(1) exposing said organic coatings, films, and layers, including photosensitive and non-photosensitive organic materials to a precursor chemical or physical treatment to create either a masking pattern on the surface of said coating or a latent image in said coating;

(2) placing said substrate in a chamber;

(3) purging said chamber with a dry gas selected from the group consisting of an inert gas and nitrogen;

(4) exposing said organic coating to a vapor consisting essentially of water-free gaseous sulfur trioxide for a determinate period of time by introducing said vapor consisting essentially of water-free gaseous sulfur trioxide into said chamber to react with said coating, said substrate being maintained at a temperature in the range from about room temperature to 400° C.;

(5) allowing an appropriate time to pass to permit reaction between said sulfur trioxide and said coating;

(6) exposing said organic coatings to a subsequent chemical or physical treatment to dislodge and remove developed portions of said organic coatings, films, and layers, including photosensitive and non-photosensitive organic materials from said substrate by ending said reaction between said sulfur trioxide and said coating by exposing said substrate to an end-point chemical treatment or an end-point physical treatment; and (7) treating said substrate to a subsequent chemical or physical treatment.

* * * * *